(12) United States Patent
Honma

(10) Patent No.: US 12,476,475 B2
(45) Date of Patent: Nov. 18, 2025

(54) IGNITER CIRCUIT HAVING AN ADJUSTABLE OVER DWELL TIME

(71) Applicant: SEMICONDUCTOR COMPONENTS INDUSTRIES, LLC, Scottsdale, AZ (US)

(72) Inventor: Hirotada Honma, Tokyo (JP)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 287 days.

(21) Appl. No.: 18/338,278

(22) Filed: Jun. 20, 2023

(65) Prior Publication Data

US 2024/0429727 A1    Dec. 26, 2024

(51) Int. Cl.
  *F02P 11/00*  (2006.01)
  *H01T 15/00*  (2006.01)
  *H02J 7/00*   (2006.01)
  *H03K 21/08*  (2006.01)

(52) U.S. Cl.
  CPC ............ *H02J 7/0063* (2013.01); *H01T 15/00* (2013.01); *H03K 21/08* (2013.01)

(58) Field of Classification Search
  CPC ... H03K 17/0828; H03K 17/168; F02P 3/055; F02P 3/0552; H02M 1/32; H02M 1/08; H01F 38/12; H02J 2207/20

USPC .......................................................... 123/630
See application file for complete search history.

(56) References Cited

U.S. PATENT DOCUMENTS

| | | | |
|---|---|---|---|
| 10,781,785 B2 * | 9/2020 | Nodake ................... | F02P 7/077 |
| 2005/0104630 A1 | 5/2005 | Kesler | |
| 2019/0028096 A1 * | 1/2019 | Lee .......................... | F02P 3/053 |
| 2019/0190238 A1 * | 6/2019 | Yamamoto .............. | F02P 3/055 |
| 2020/0095971 A1 * | 3/2020 | Tang ......................... | F02P 3/05 |

* cited by examiner

Primary Examiner — Logan M Kraft
Assistant Examiner — James J Kim
(74) Attorney, Agent, or Firm — Brake Hughes Bellermann LLP

(57) ABSTRACT

An ignition system may include an igniter circuit to control the current in a coil supplied by a battery based on an input signal from an engine control unit. To prevent overheating, the igniter circuit may be configured to shut down the current in the coil when the input signal is held high for an over dwell period. The disclosed igniter circuit is configured with circuitry to automatically adjust the over dwell period used based on a condition of the battery to prevent overheating without prematurely shutting down. The automatic adjustment includes indirectly monitoring the battery condition based on a current or a voltage of a switching device coupled to the coil.

20 Claims, 8 Drawing Sheets

IGNITER CIRCUIT HAVING AN ADJUSTABLE OVER DWELL TIME

FIELD OF THE DISCLOSURE

The present disclosure relates to power electronics for switching and more specifically to an igniter circuit for an automotive application.

BACKGROUND

Automotive ignition systems may include a battery, an inductive coil and an igniter circuit. The igniter circuit can include a switching device in series with the battery and the inductive coil. When the switching device is short-circuited, current can flow from the battery through the inductive coil. After a charging period, the switching device can be open-circuited so that the current in the inductive coil is abruptly terminated. The abrupt termination of the current can cause a large voltage across the coil, which can be used to generate a spark for ignition. The igniter circuit may monitor the charging period so that it does not exceed a maximum limit (i.e., over dwell time), which could cause overheating and/or damage to the ignition system.

SUMMARY

After an over dwell time (i.e., over dwell period), current conducted by a coil in an ignition system can be gradually reduced by an igniter circuit to prevent damage (e.g., over heating). The present disclosure describes ignition systems and methods for sensing the voltage of the battery and adjusting the duration of an over dwell time automatically.

In some aspects, the techniques described herein relate to a method for shutting down a current in an ignition system, the method including: receiving an input signal to configure a switching device in an ON condition, the switching device coupled in series with a coil; starting a timer; sensing the current in the coil after the switching device is configured in the ON condition; measuring, based on the timer, a rise time corresponding to a time for the current to satisfy a criterion; calculating a soft-shutdown delay based on the rise time; waiting the soft-shutdown delay; and starting a soft-shutdown to reduce (i.e., shut down) the current in the coil after the soft-shutdown delay.

In some aspects, the techniques described herein relate to an ignition system, including: a coil coupled at a first side to a battery; and an igniter circuit including: a switching device coupled to a second side of the coil; a current controller configured to control a current condition of the switching device; and an over dwell circuit configured to: measure a rise time of a current conducted by the switching device after being configured in an ON condition; and trigger the current controller to start a soft shutdown of the current after a soft-shutdown delay, the soft-shutdown delay based on the rise time of the current.

In some aspects, the techniques described herein relate to a method for shutting down a current in an ignition system, the method including: receiving an input signal to configure a switching device in an ON condition, the switching device coupled in series with a coil; delaying the input signal by a delay period to hold the switching device in an OFF condition for the delay period before configuring the switching device in the ON condition; sensing a voltage of the switching device during the delay period; computing an over dwell time based on the voltage of the switching device; waiting the over dwell time; and starting a soft shutdown to shut down of the current after the over dwell time based on the voltage of the switching device.

In some aspects, the techniques described herein relate to an ignition system, including: a coil coupled at a first side to a battery; and an igniter circuit including: a switching device coupled to a second side of the coil; a current controller configured to control a current condition of the switching device; and an over dwell circuit configured to: delay an input signal coupled to a controlling terminal of the switching device so that the current condition of the switching device is held in an OFF condition for a delay period before being configured in an ON condition; sense a voltage of the switching device during the delay period; and trigger the current controller to start a soft shutdown of the current condition after an over dwell time, the over dwell time based on the voltage of the switching device during the delay period.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

The components in the drawings are not necessarily to scale relative to each other. Like reference numerals designate corresponding parts throughout the several views.

DETAILED DESCRIPTION

An igniter circuit of an automotive system may monitor a charging period of an inductive coil so that it does not exceed a maximum limit (i.e., over dwell time), which could cause overheating and/or damage to the ignition system. For example, if the switching device is controlled by an input signal to conduct current at the end of an over dwell period, the igniter circuit may be configured to begin a soft shutdown to reduce the current.

A soft shutdown (i.e., SSD) may include controlling a switching device, in series with a battery and a coil, to increase its resistance from a short-circuited condition (i.e., ON condition) to an open-circuited condition (i.e., OFF condition) gradually over an SSD period to reduce the current in the inductive coil. The gradual reduction of the coil current can limit a voltage across the inductive coil caused by a back electromotive force (EMF) and limiting the voltage can prevent an unwanted spark in the ignition system. One technical problem with this fixed over dwell time approach is that the battery voltage can vary over a large range so that an over dwell period suitable for a lower battery voltage may be too long for a higher battery voltage, and vice versa.

Figure 1:
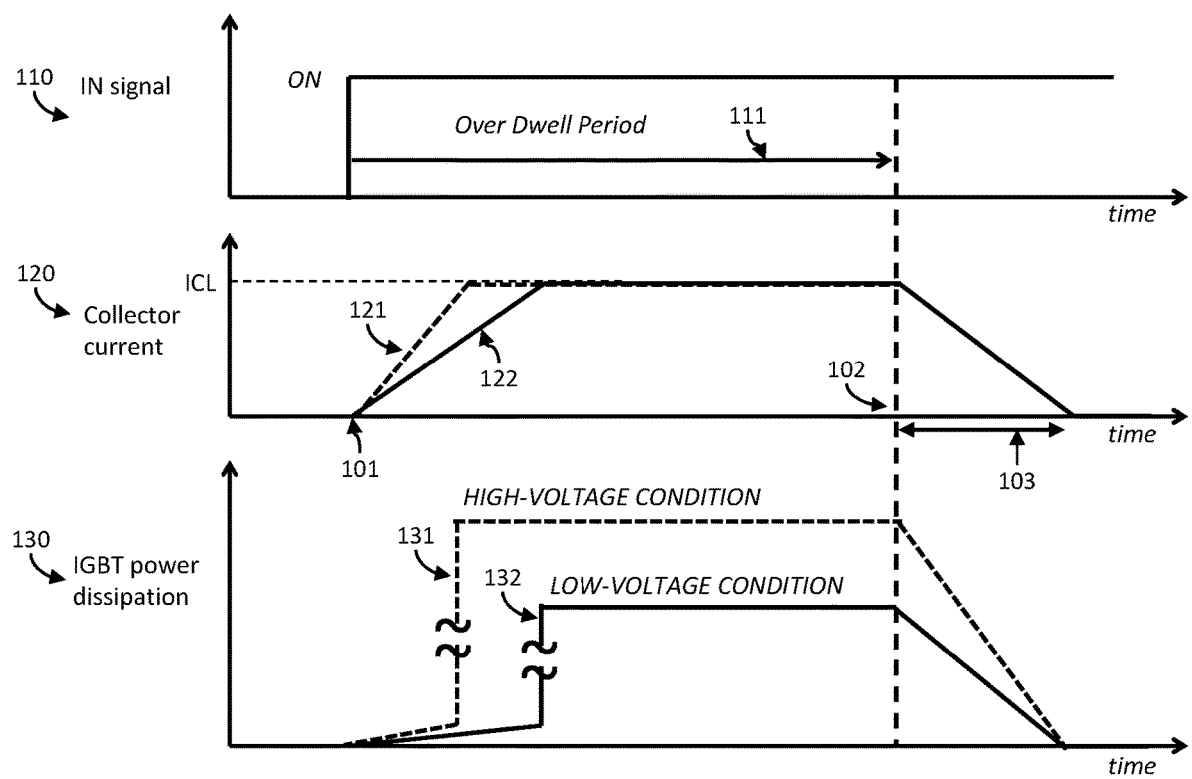
FIG. 1 includes graphs illustrating the power dissipated by a switching device in an ignition system for a battery in a high-voltage condition and a low-voltage condition according to a possible implementation of the present disclosure.

FIG. 1 includes graphs illustrating the power dissipated by a switching device (e.g., insulated gate bipolar transistor (IGBT)) in an ignition system. The graphs illustrate the differences that exist between battery conditions.

A first graph 110 of FIG. 1 illustrates an input (IN) signal to control a switching device of the ignition system. A first level (e.g., LOW) of the input signal can correspond to the current condition of the switching device being OFF (i.e., not conducting), and a second level (e.g., HIGH) of the input signal can correspond to the current condition of the switching device being ON (i.e., conducting). As shown, at the conclusion of an over dwell time (i.e., over dwell period 111), the input signal is HIGH. Accordingly, a current controller may intervene to discharge the coil.

The coil is in series with the switching device so that a collector current of the switching device corresponds to a current in the coil. In particular, the coil can be coupled between the battery and a terminal of the switching device. For example, a first side (i.e., first terminal) of the coil may be coupled to a battery, while the second side (i.e., second terminal) of the coil may be coupled to a collector terminal of an IGBT. The battery can have a battery voltage that can charge (i.e., increase) the coil current while the IGBT is conducting, and the coil current can increase until it reaches a current limit (ICL), which corresponds to the conductivity of the switching device.

FIG. 1 includes a second graph 120 that illustrates the current conducted by the switching device. As shown, at a first time 101, at which the input signal configures the switching device ON, the collector current (i.e., current in the coil) begins to increase as the coil is charged by the battery. As shown, the rate at which the collector current (i.e., coil current) increases depends on a voltage condition of the battery. A high-voltage condition corresponds to a battery voltage being higher than a low-voltage condition. In the high voltage condition 121, the current increases to its maximum value (i.e., current limit (ICL)) faster than in the low-voltage condition 122.

If the input signal (IN) is still HIGH at the end of the over dwell time (i.e., over dwell period 111), a soft shut down may decrease the current. As shown in FIG. 1, at a second time 102, the collector current (i.e., current in the coil) is reduced from its maximum value according to a soft shutdown profile. In practice, a current controller triggered for soft shutdown may, for example, linearly decrease the current limit of the switching device over a soft shutdown period 103 until the collector current is approximately zero.

FIG. 1 includes a third graph 130 corresponding to the power dissipated in the switching device (e.g., IGBT) in the high-voltage condition 131 (i.e., relatively high battery voltage) and in the low-voltage condition 132 (i.e., relatively low battery voltage). The power dissipated by the switching device in the high-voltage condition is higher than the power dissipated by the switching device in the low-voltage condition because the current through the switching device, in the high-voltage condition, reaches its current limit (ICL) faster than in the low-voltage condition. Accordingly, a shorter over dwell time (i.e., over dwell period 111) may be necessary for the high-voltage condition 131 to prevent overheating because of the higher-power dissipation.

Using a fixed (shorter) over dwell time to trigger an SSD in both the high-voltage condition and the low-voltage condition may be problematic because it may be too short for the low-voltage condition. In the low-voltage condition, the current through the switching device takes longer to reach its limit. As a result, a soft shutdown may be triggered prematurely. Accordingly, it may be desirable to control the over dwell time (i.e., over dwell period) based on the voltage of the battery (i.e., battery voltage). In particular, a relatively high battery voltage can correspond to a shorter over dwell period than a relatively low battery voltage.

Controlling the over dwell time based on the battery voltage may be problematic when the size and complexity of the igniter circuit is limited. The battery voltage may be in a higher voltage domain than used by the igniter circuit. Accordingly, coupling the battery to the igniter circuit can require additional circuitry necessary for receiving and transitioning the higher voltage domain to the voltage domain used by the igniter circuit. Additionally, a timing circuit necessary to handle a typical over dwell period (e.g., milliseconds) may require a device (or devices) that is unreasonably large for a size-constrained igniter circuit. For example, the timing circuit may require a capacitor on the order of a microFarad (e.g., C=0.1 µF), which is too large for some implementations.

The present disclosure describes an igniter circuit to address at least the above-mentioned technical problems. The igniter circuit has an over dwell time that is controlled based on the voltage of the battery, without requiring a direct connection to (i.e., without requiring a terminal for) the battery. The disclosed igniter circuit includes the adjustable over dwell time feature with circuitry that is small and low complexity so that the igniter circuit can be made (e.g., as an integrated circuit) smaller and more cost efficient, compared to other over dwell timer approaches.

Figure 2:
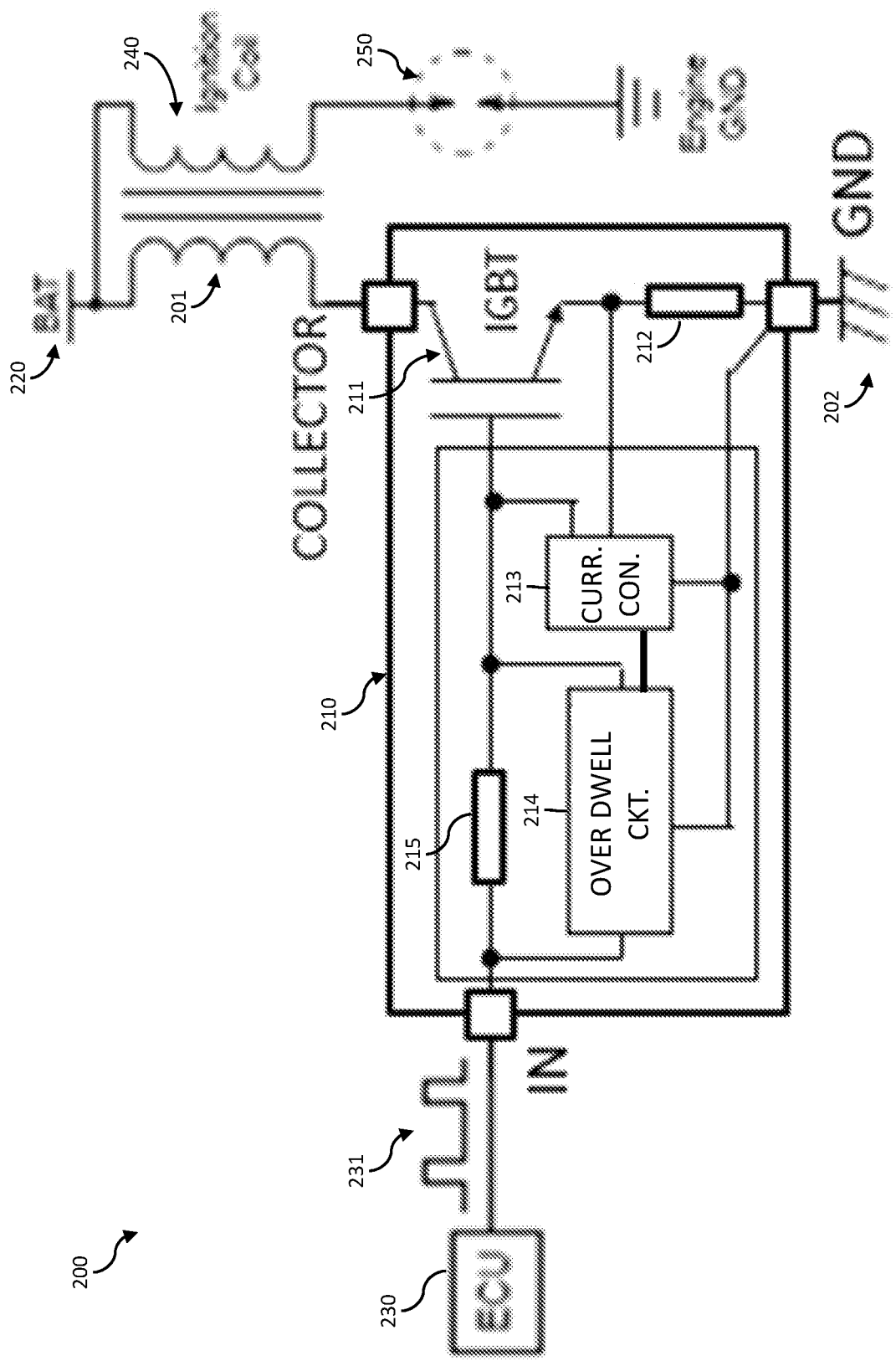
FIG. 2 is a schematic block diagram of an ignition system according to a possible implementation of the present disclosure.

FIG. 2 is a schematic block diagram of an ignition system 200 according to a possible implementation of the present disclosure. As shown, a coil 201 is coupled (e.g., directly connected) between a battery and a terminal of an igniter circuit 210.

The igniter circuit 210 may be implemented as an integrated circuit with at least an input terminal (IN), a collector terminal (COLLECTOR) and a ground terminal (GND). The igniter circuit 210 may not require a battery terminal or other circuitry for directly monitoring a battery voltage (VB) of the battery 220. The igniter circuit 210 can include a switching device 211 (e.g., IGBT) that is coupled between the coil 201 and a ground 202. For example, the switching device may be an IGBT that is coupled at a collector terminal to the coil 201, coupled at an emitter terminal to a current sense resistor 212, and coupled at a gate terminal to an input via a gate resistor 215. The input signal 231 to the igniter circuit 210 may be from an engine control unit 230 (ECU). The ignition system 200 may further include an ignition coil 240 that is magnetically coupled to the coil 201 in a transformer that can step-up the voltage of the coil 201 to a voltage sufficient to generate a spark at a gap 250.

The igniter circuit 210 may include a current controller 213 configured to control the current condition of the switching device 211 in a soft shut down. For example, when triggered, the current controller 213 may be configured to output an SSD signal to gradually lower a current limit of the switching device 211 so that it gradually changes from an ON condition to an OFF condition. In other words, the current controller 213 may be configured to output a voltage that linearly decreases at an SSD rate over an SSD period. The SSD rate and the SSD period (i.e., SSD profile) may be preset to a value sufficient for generating a spark from being induced in the coil 201 during shutdown.

The igniter circuit 210 further includes an over dwell circuit 214. The over dwell circuit 214 may be configured to time how long the input signal (IN) is held at the ON level (e.g., HIGH level). If the input signal is still ON after an over dwell time (i.e., over dwell period) has expired, then the over dwell circuit 214 may trigger the current controller 213 to start a soft shut down.

The igniter circuit 210 can adjust the over dwell time (i.e., over dwell period 111) based on sensing (i.e., measuring) a signal of the switching device 211 instead of directly sensing the voltage of the battery 220 itself. In a first implementation, the signal sensed is a current of the switching device 211 and in a second implementation the signal sensed is a voltage of the switching device 211.

Figure 3:
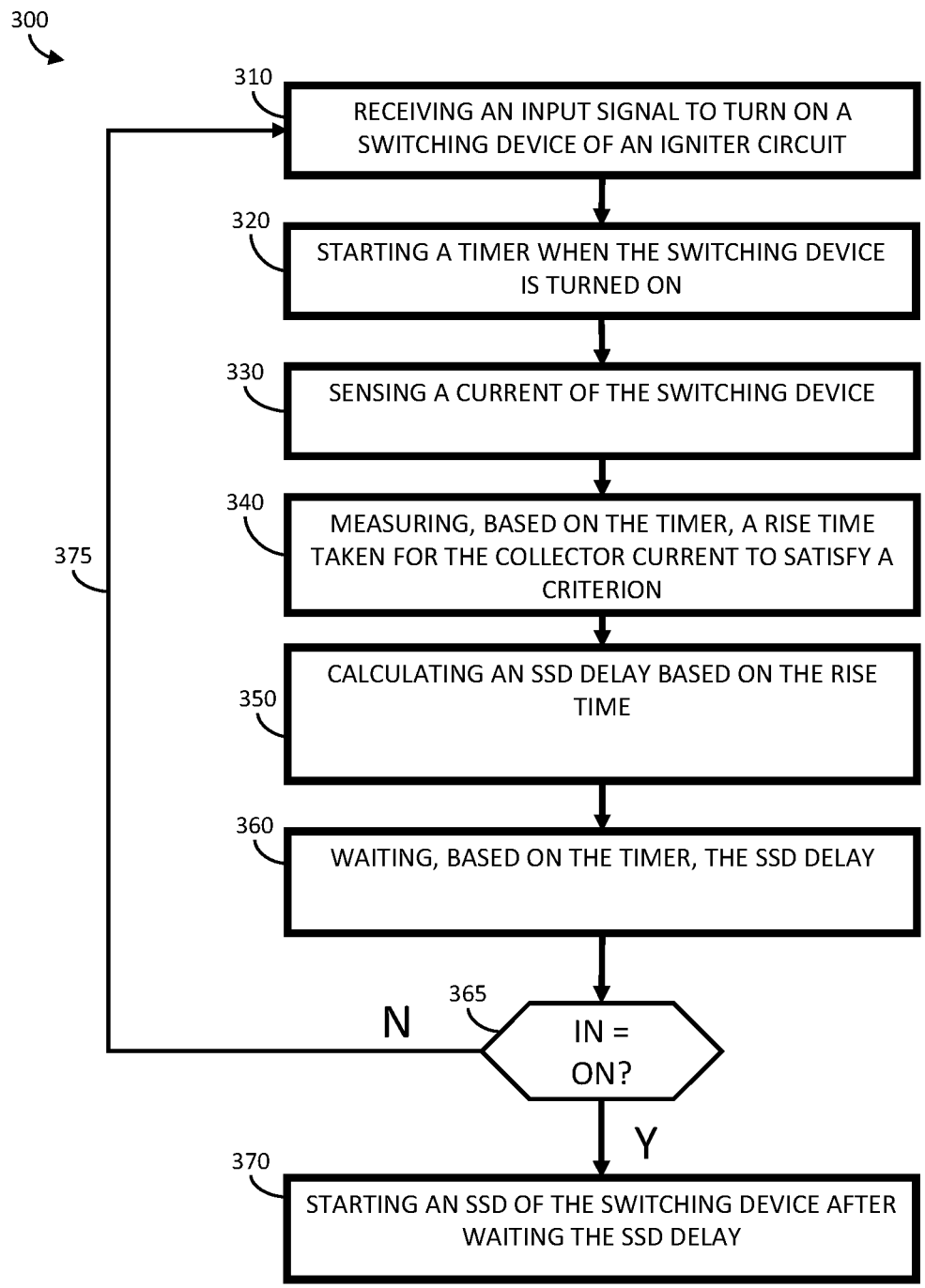
FIG. 3 is a method for shutting down a current in an ignition system according to a first possible implementation of the present disclosure.

FIG. 3 is a method for shutting down a current in an ignition system according to a first possible implementation of the present disclosure. The method 300 includes receiving 310 an input signal (i.e., at an igniter circuit) to configure a switching device (e.g., IGBT) into an ON condition. The switching device is coupled in series with a coil (e.g., primary coil) so in the ON condition the current in the switching device may be equal to the current in the coil.

The method 300 further includes starting 320 a timer. For example, the timer may be started at the same time that the input signal transitions to a level (e.g., HIGH) to turn ON the switching device. The method 300 further includes sensing 330 a current of the switching device after the switching device is configured in the ON condition. For example, a collector current of an IGBT in series with the coil may be sensed as the current in the coil when the IGBT is conducting (e.g., in the ON condition). The method 300 further includes measuring 340 a rise time corresponding to a time necessary for the current to satisfy a criterion. For example, starting at an initial time (T0) when the IGBT is turned ON, the collector current may be sensed and compared to a threshold current (i.e., ICT). Then, when the collector current becomes greater than or equal to the threshold, the rise time may be determined based on a time (T1) of the (running) timer.

The method 300 further includes calculating 350 a soft-shutdown delay (i.e., SSD delay) based on the rise time (e.g., T1-T0). The SSD delay can be the amount of time to wait before triggering (if necessary) a soft shutdown. Accordingly, the method 300 further includes waiting 360 (e.g., based on the timer) the SSD delay.

After waiting the SSD delay, the method 300 can include determining 365 if a soft shutdown is required. For example, if the input signal (IN) is at the ON level (e.g., HIGH), then a soft shutdown of the current may be required. In this case (i.e., Y), the method 300 includes starting 370 a soft-shutdown to shut down the current in the ignition system (i.e., coil and switching device). Otherwise, the method 300 may reset 375 until another input signal to turn ON a switching device occurs, at which time the method 300 may repeat.

Figure 4:
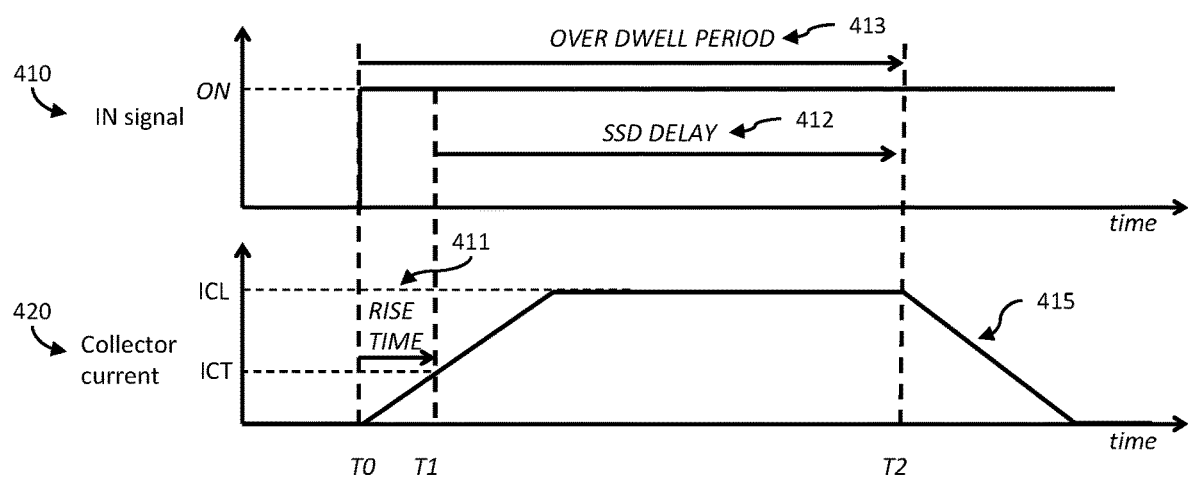
FIG. 4 includes graphs illustrating possible signals in an ignition system configured to perform the method of FIG. 3.

FIG. 4 includes graphs illustrating possible signals in an ignition system configured to perform the method of FIG. 3. A first graph 410 shows an input signal (e.g., at a gate of a switching device) that transitions ON (i.e., HIGH) at an initial time (T0). In this level the input signal can configure a switching device in the ON condition. A second graph 420 shows a current (i.e., collector current) of the switching device. As shown, current begins to increase when the ON condition begins at the initial time (T0). At a first time (T1), the current reaches a threshold level (ICT). A rise time 411 can be determined as the difference between the first time and the initial time (i.e., RISE TIME=T1−T0). A soft-shutdown delay (SSD delay 412) may be calculated based on the rise time 411. For example, the SSD delay 412 may be the rise time 411 multiplied by a fixed value (i.e., SSD DELAY=(RISE TIME)·(A)). As a result, a relatively short rise time may result in a shorter SSD delay as compared to a longer SSD delay of a relatively long rise time (i.e., short rise time<long rise time). The shorter SSD delay can reduce a power dissipated over an over dwell period 413.

As shown in FIG. 4, the over dwell period 413 may be the sum of the rise time 411 and the SSD delay 412. At a second time (T2) after the SSD delay 412, a soft-shutdown 415 occurs to reduce the current in the switching device (i.e., the current in the coil). The soft-shutdown 415 may be triggered by the input signal (IN) being in the ON condition (i.e., HIGH) at the conclusion of the SSD delay 412 (i.e., at the conclusion of the over dwell period 413).

Figure 5:
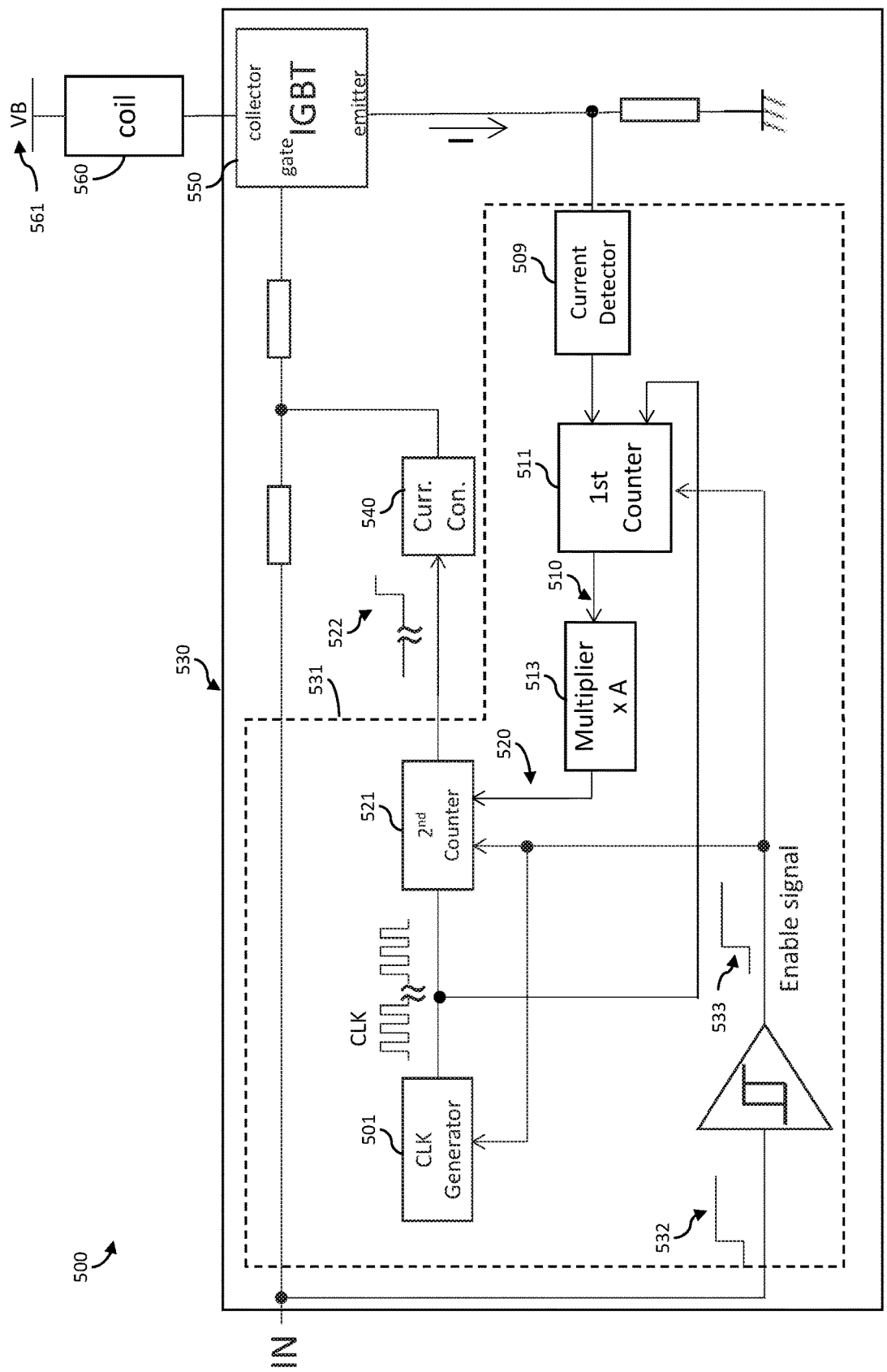
FIG. 5 is a schematic block diagram of an ignition system according to a first possible implementation of the present disclosure.

FIG. 5 is a schematic block diagram of an ignition system according to a first possible implementation of the present disclosure. The ignition system 500 includes a coil 560 coupled at a first side to a battery voltage 561 (VB) of a battery and coupled at a second side to a switching device 550 (e.g., IGBT) of an igniter circuit 530. The switching device 550 can receive an input signal at a gate terminal that configures the switching device in an ON condition so that it conducts a current (I) between a collector terminal and an emitter terminal. The current (I) can be sensed to adjust an over dwell period based on the battery voltage 561 instead of sensing the battery voltage directly.

The igniter circuit 530 includes an over dwell circuit 531 configured to measure a rise time of the current (I) from the initial time (T0) that the current is started to a first time (T1) that the current satisfies a criterion. The over dwell circuit 531 is further configured to wait for a soft shutdown delay to expire at a second time (T2) before triggering a soft shutdown of the current. For these time measurements, the over dwell circuit 531 includes (i) a first timer implemented using a clock generator 501 and a first counter 511 and (ii) a second timer implemented using the clock generator 501 and a second counter 521. The first counter 511 and the second counter 521 may be initialized (e.g., reset, started) by an enable signal 533 based on the input signal 532. For example, at the initial time (T0) the first counter 511 and the second counter 521 may be set to zero.

The over dwell circuit 531 may further include a current detector 509. In a possible implementation, the current detector 509 may be configured to compare the current (I) to a threshold (ICT) and to output a signal to the first counter 511 when the current is greater than or equal to the threshold (ICT). The signal from the current detector 509 may trigger the first counter 511 to output a rise-time count 510 corresponding to a number of cycles counted when the current is greater than or equal to the threshold.

The over dwell circuit 531 may further include a multiplier 513. The multiplier 513 may be configured to multiply the rise-time count 510 by a fixed value (A) in order to generate a delay count 520 corresponding to the SSD delay. In other words, the delay count 520 may be based on the rise-time count. The fixed value (A) may be based on a target over dwell period (e.g., 10 milliseconds) for the switching device 550. The delay count 520 may be coupled to the second counter 521, and the second counter 521 may be configured to output an SSD trigger signal 522 when the count of the second counter 521 reaches the delay count 520.

The igniter circuit 530 further includes a current controller 540 coupled to a gate of the switching device in order to control its current condition. The current controller 540 may receive the SSD trigger signal 522 from the second counter 521 at the second time (T2) after the SSD delay. The SSD trigger signal 522 may trigger the current controller 540 to start a soft shutdown to reduce the current (I) of the switching device (i.e., coil).

Figure 6:
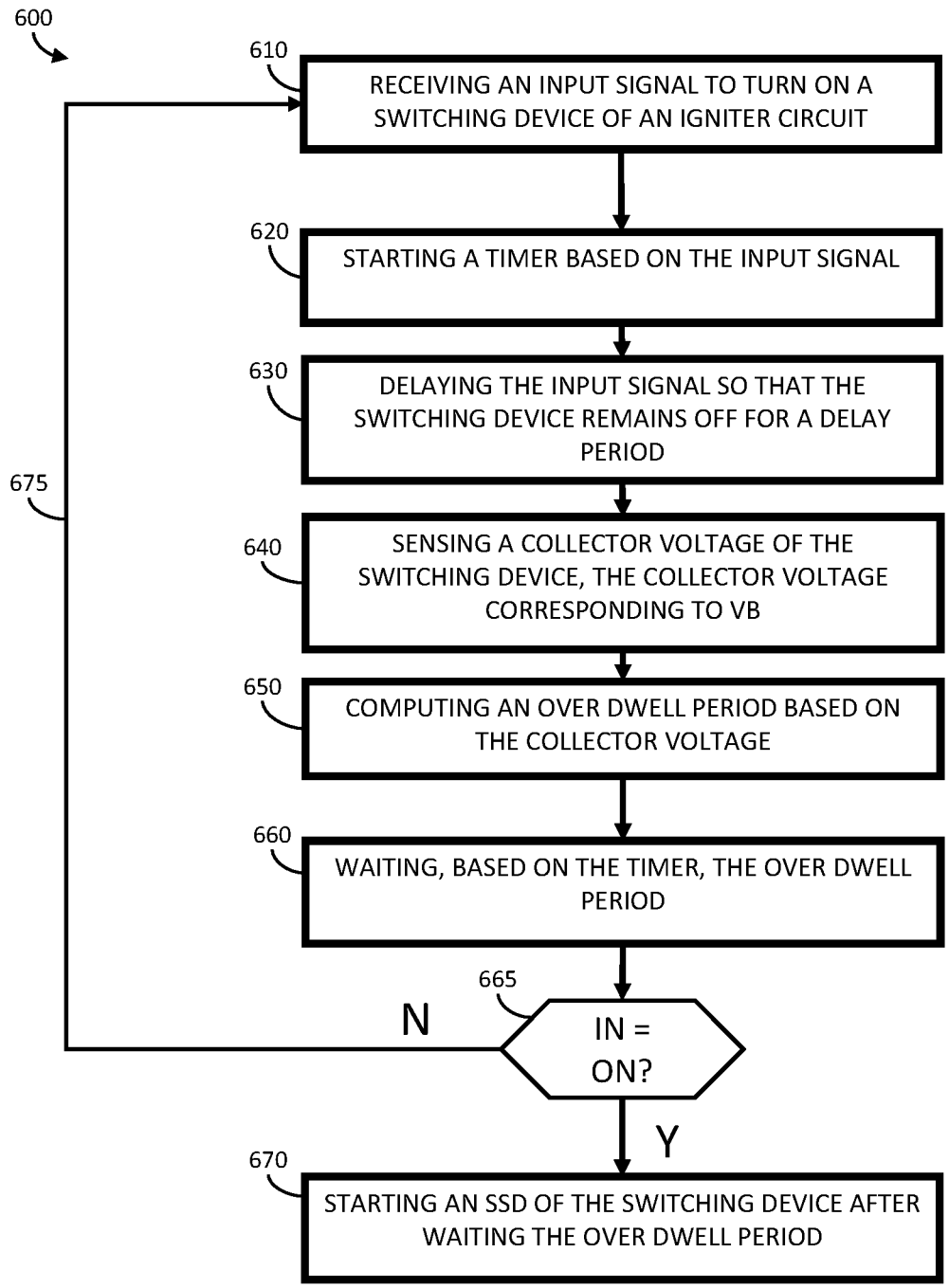
FIG. 6 is a method for shutting down a current in an ignition system according to a second possible implementation of the present disclosure.

FIG. 6 is a method for shutting down a current in an ignition system according to a second possible implementation of the present disclosure. The method 600 includes receiving 610 an input signal to turn ON the switching device of an igniter circuit and starting 620 (e.g., simultaneously starting) a timer. The method 600 further includes delaying 630 the input signal so that the switching device remains OFF. In other words, the input signal to configure the switching device in the ON condition is delayed by a delay period so that the switching device is held in the OFF condition for the delay period. In other words, the input signal is delayed to hold the switching device in an OFF condition for the delay period before configuring the switching device in the ON condition. While the switching device is in the OFF condition no current flows, and a voltage at a collector terminal of the switching device may correspond to (e.g., may equal) a voltage of the battery (VB). Accordingly, the method 600 includes sensing 640 the collector voltage of the switching device and adjusting the over dwell period based on the voltage of the switching device. In particular, the method 600 includes computing 650 an over dwell period based on the collector voltage. The method 600 further includes waiting 660 the over dwell time before determining 665 if a soft shutdown is necessary. For example, if the input signal (IN) is at the ON level (e.g., HIGH), then a soft shutdown of the current may be required. In this case (i.e., Y), the method 600 includes starting 670 a soft-shutdown to shut down the current in the ignition system (i.e., coil and switching device). Otherwise, the method 600 may reset 675 until another input signal to turn ON a switching device occurs, at which time the method 600 may repeat.

Figure 7:
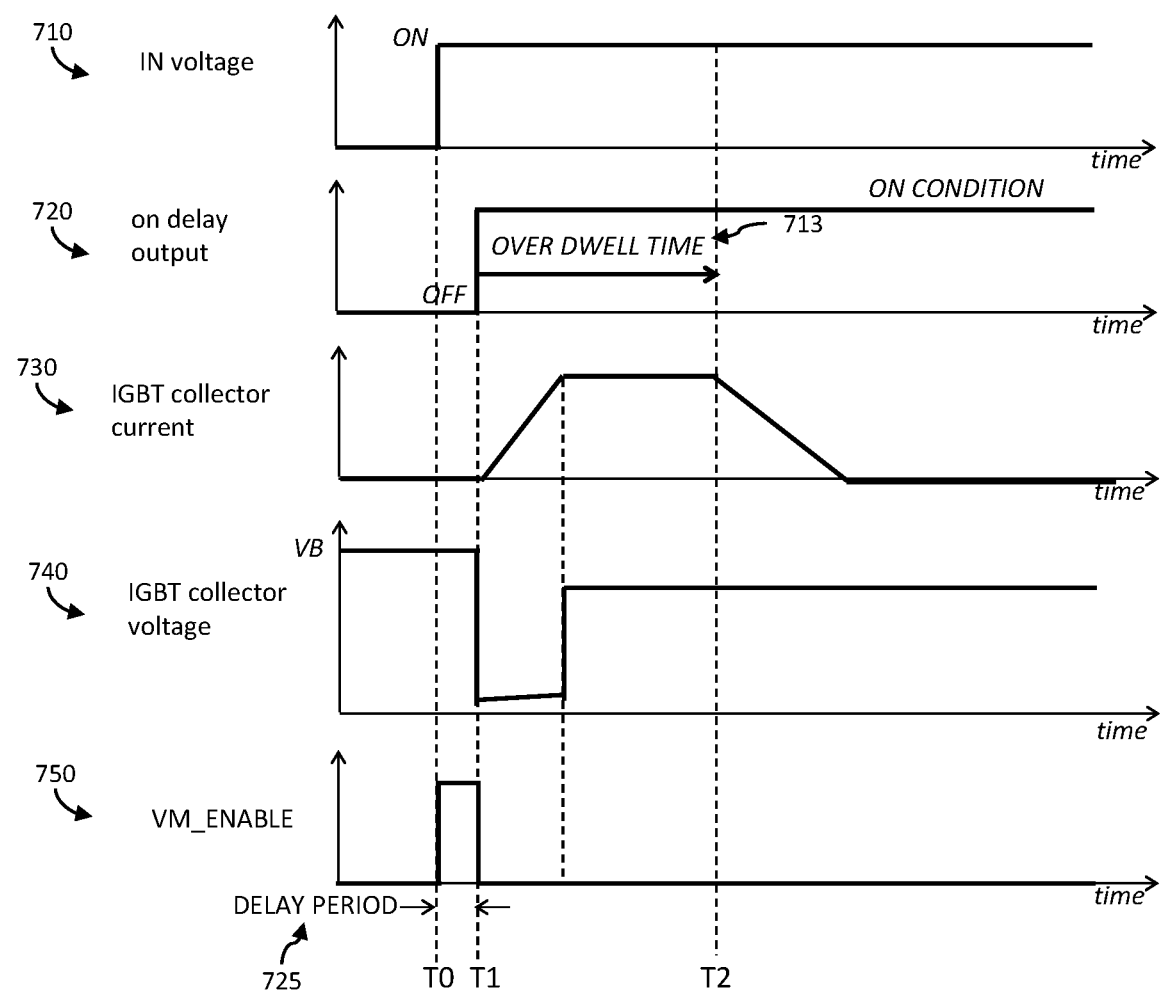
FIG. 7 includes graphs illustrating possible signals in an ignition system configured to perform the method of FIG. 6.

FIG. 7 includes graphs illustrating possible signals in an ignition system configured to perform the method of FIG. 6. A first graph 710 shows an input signal (e.g., at a gate terminal of a switching device) that transitions ON (i.e., HIGH) at an initial time (T0). A second graph 720 shows the input signal delayed by a delay period 725. The delay period 725 may begin at the initial time (T0) and end at a first time (T1). A third graph 730 shows a current (i.e., collector current) of the switching device. As shown, the current remains zero through the delay period 725 because the switching device is in the OFF condition. A fourth graph 740 shows a collector voltage of the switching device. As shown, the collector voltage can equal the battery voltage (VB) during the delay period. The battery voltage (VB) may be measured during the delay period 725 by sensing the collector voltage of the switching device. This sensing may be enabled by a voltage monitor enable signal (VM_ENABLE), as shown in a fifth graph 750. After sensing the battery voltage, an over dwell time 713 may be calculated. For example, a high collector voltage sensed during the delay period may result in a shorter over dwell time as compared to a longer over dwell time of a relatively low collector voltage measured during the delay period. The shorter over dwell time can reduce a power dissipated for higher battery voltages. After waiting the over dwell time 713, a soft shutdown may be triggered by the input signal (IN) being in the ON condition (i.e., HIGH) at the conclusion of the over dwell time 713 (i.e., T2).

Figure 8:
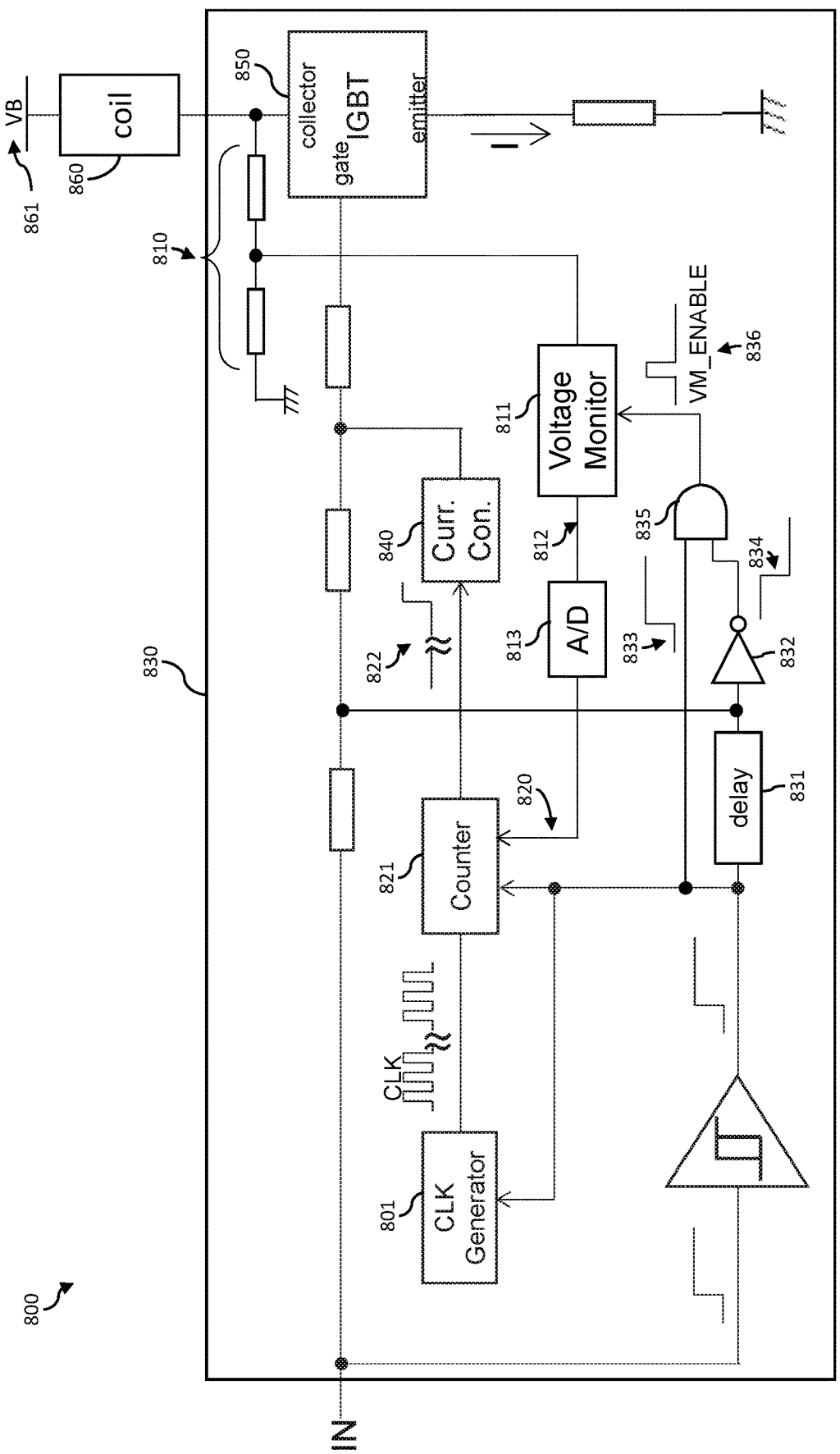
FIG. 8 is a schematic block diagram of an ignition system according to a second possible implementation of the present disclosure.

FIG. 8 is a schematic block diagram of an ignition system according to a second possible implementation of the present disclosure. The ignition system 800 includes a coil 860 coupled at a first side to a battery voltage 861 (VB) of a battery and coupled at a second side to a switching device 850 (e.g., IGBT) of an igniter circuit 830. The switching device 850 can receive an input signal at a gate terminal that configures the switching device in an OFF condition or in an ON condition. In the ON condition, the switching device 850 conducts a current (I) between a collector terminal and an emitter terminal, and in the OFF condition a voltage at the collector terminal (i.e., collector voltage) of the switching device can equal the battery voltage 861.

The igniter circuit 830 includes an over dwell circuit configured to sense (i.e., measure) the collector voltage while the switching device 850 is in the OFF condition. The over dwell circuit of the igniter circuit 830 includes a delay 831 and an inverter 832 to generate a delayed and inverted version 834 of the input signal 833. The input signal 833 and the delayed, inverted input signal 834 are input to a logic gate (e.g., AND gate 835) that is configured to compare the signals to generate a voltage-monitor enable signal 836 (i.e., VM_ENABLE). In other words, the igniter circuit 830 includes a logic gate configured to compare the delayed input signal to the input signal to create (i.e., generate) an enable signal to configure the over dwell circuit to sense the voltage of the switching device. A delayed version input signal can also be coupled to a controlling terminal (e.g., gate terminal) of the switching device 850 so that the switching device 850 is held in the OFF condition for a delay period corresponding to the delay 831. As a result, during the delay period the switching device 850 is in an OFF condition and the voltage-monitor enable signal is active (e.g., HIGH).

The over dwell circuit further includes a voltage divider 810 configured to reduce the battery voltage 861 measured at the collector terminal while the switching device 850 is in the OFF condition. The voltage divider 810 is coupled to a voltage monitor 811 configured to generate a dwell time voltage 812 corresponding to the battery voltage 861 while the voltage-monitor enable signal 836 is active (e.g., HIGH). The over dwell circuit further includes an analog to digital converter (i.e., digitizer 813) configured to convert the dwell time voltage 812 to a dwell time count 820. For example, the voltage of the switching device may be digitized by an analog to digital converter (A/D) to obtain (e.g., generate, create) the dwell time count. The dwell time count 820 corresponds to the voltage of the switching device 850, which corresponds to the voltage of the battery (VB) while the switching device 850 is in the OFF condition. For example, a higher battery voltage may generate a smaller dwell time count than a lower battery voltage.

The over dwell circuit is configured to wait for an over dwell time before transmitting an SSD trigger signal 822 to a current controller 840 for a soft shutdown of the current (I). The waiting may be carried out using a timer. Accordingly, the over dwell circuit of the igniter circuit 830 may include a timer implemented using a clock generator 801 to generate a periodic clock signal (CLK) and a counter 821 configured to count cycles of the periodic clock signal. The counter 821 may be triggered to begin counting based on the input signal 833 and may count until it reaches the dwell time count 820. Upon (e.g., in response to) reaching the dwell time count 820 the counter 821 may output the SSD trigger signal 822.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

It will be understood that, in the foregoing description, when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

The invention claimed is:

1. A method, comprising:
   receiving an input signal to configure a switching device in an ON condition, the switching device coupled in series with a coil;
   starting a timer;
   sensing a current in the coil after the switching device is configured in the ON condition;
   measuring, based on the timer, a rise time corresponding to a time for the current to satisfy a criterion;
   calculating a soft-shutdown delay based on the rise time; and
   starting a soft-shutdown to reduce the current in the coil after the soft-shutdown delay.

2. The method according to claim 1, wherein the timer is a clock generator and measuring the rise time includes:
   counting cycles of the clock generator;
   comparing the current to a threshold; and
   outputting a rise-time count corresponding to the rise time, the rise-time count being a number of cycles counted when the current is greater than or equal to the threshold.

3. The method according to claim 2, wherein calculating the soft-shutdown delay based on the time for the current to satisfy the criterion includes:
   multiplying the rise-time count by a fixed value to generate a delay count.

4. The method according to claim 3, further comprising:
   triggering the soft-shutdown of the current in response to counting to the delay count.

5. The method according to claim 1, wherein a sum of the rise time and the soft-shutdown delay corresponds to an over dwell period, the over dwell period corresponding to a battery voltage coupled to the coil so that a relatively high battery voltage corresponds to a shorter over dwell period than a relatively low battery voltage.

6. The method according to claim 1, wherein the switching device is an insulated gate bipolar transistor.

7. The method according to claim 6, wherein sensing the current in the coil includes:
   measuring a voltage at a resistor coupled between an emitter terminal of the insulated gate bipolar transistor and a ground; and
   measuring the rise time as the time for the voltage to equal, or exceed, a threshold.

8. The method according to claim 1, further comprising:
   determining the rise time as the time between an initial time when the switching device is configured in the ON condition and a first time when the current equals, or exceeds, a threshold;
   waiting a period between the first time and a second time when the soft-shutdown delay expires; and
   determining a condition of the switching device at the second time.

9. The method according to claim 8, further comprising:
   triggering a current controller to decrease a gate voltage of the switching device linearly over a soft shutdown period when the condition of the switching device at the second time is the ON condition.

10. The method according to claim 8, further comprising:
    resetting the timer when the condition of the switching device at the second time is an OFF condition.

11. An ignition system, comprising:
    a coil coupled at a first side to a battery; and
    an igniter circuit including:
      a switching device coupled to a second side of the coil;
      a current controller configured to control a current condition of the switching device; and
      an over dwell circuit configured to:
        measure a rise time of a current conducted by the switching device after being configured in an ON condition; and
        trigger the current controller to start a soft shutdown of the current after a soft-shutdown delay, the soft-shutdown delay based on the rise time of the current.

12. The ignition system according to claim 11, wherein the over dwell circuit includes:
    a clock generator;
    a first counter configured to count cycles of the clock generator; and
    a current detector configured to output a signal to the first counter in response to determining that the current conducted by the switching device is greater than or equal to a threshold, the signal triggering the first counter to output a rise-time count of the cycles of the clock generator.

13. The ignition system according to claim 12, wherein the over dwell circuit further includes:
   a multiplier configured to multiply the rise-time count by a fixed value to generate a delay count, the fixed value corresponding to an over dwell period.

14. The ignition system according to claim 13 further including:
   a second counter configured to receive the delay count from the multiplier and output a soft shutdown trigger signal to the current controller after counting to the delay count.

15. The ignition system according to claim 11, wherein a sum of the rise time and the soft-shutdown delay corresponds to an over dwell period, the over dwell period corresponding to a battery voltage of the battery so that a relatively high battery voltage corresponds to a shorter over dwell period than a relatively low battery voltage.

16. The ignition system according to claim 11, wherein the switching device is an insulated gate bipolar transistor.

17. The ignition system according to claim 16, further comprising:
   a resistor coupled between an emitter terminal of the insulated gate bipolar transistor and a ground, and
   a current detector coupled to the emitter terminal, the current detector configured to configure a first counter to measure the rise time as a time for a voltage of the resistor to equal, or exceed, a threshold.

18. The ignition system according to claim 11, further comprising:
   a first counter configured to determine the rise time as a time between an initial time when the switching device is configured in the ON condition and a first time when the current equals, or exceeds, a threshold; and
   a second counter configured to wait a period between the first time and a second time when the soft-shutdown delay expires and further configured to determine a condition of the switching device at the second time.

19. The ignition system according to claim 18, wherein:
   the second counter is configured to trigger the current controller to decrease a gate voltage of the switching device linearly over a soft-shutdown period when the condition of the switching device at the second time is the ON condition.

20. The ignition system according to claim 18, wherein:
   the first counter is reset when the condition of the switching device at the second time is an OFF condition.

* * * * *